(12) United States Patent
Kim et al.

(10) Patent No.: US 8,164,156 B2
(45) Date of Patent: Apr. 24, 2012

(54) FUSE STRUCTURE FOR HIGH INTEGRATED SEMICONDUCTOR DEVICE

(75) Inventors: Kyu Tae Kim, Seoul (KR); Ki Soo Choi, Goyang (KR)

(73) Assignee: Hynix Semicondutor Inc., Icheon (KR)

( * ) Notice: Subject to any disclaimer, the term of this patent is extended or adjusted under 35 U.S.C. 154(b) by 158 days.

(21) Appl. No.: 12/648,254

(22) Filed: Dec. 28, 2009

(65) Prior Publication Data

US 2011/0068432 A1    Mar. 24, 2011

(30) Foreign Application Priority Data

Sep. 18, 2009   (KR) .................. 10-2009-0088370

(51) Int. Cl.
*H01L 23/525* (2006.01)
*H01L 21/768* (2006.01)

(52) U.S. Cl. ............. 257/529; 438/601; 257/E23.149; 257/E21.592

(58) Field of Classification Search .............. 257/529, 257/E23.149, E21.592, 50, 209, 530, E23.147; 337/297; 438/131, 132, 215, 281, 333, 467, 438/600, 601
See application file for complete search history.

(56) References Cited

U.S. PATENT DOCUMENTS 6,144,074 A * 11/2000 Akita ..................... 257/355
6,661,330 B1 * 12/2003 Young ..................... 337/297
6,686,644 B2   2/2004 Tatematsu et al.

* cited by examiner

*Primary Examiner* — Eugene Lee
*Assistant Examiner* — Monica D Harrison

(57) ABSTRACT

A semiconductor device comprises a fuse having a blowing region at a center part for selectively connecting different two terminals; and a dummy contact positioned under the blowing region for forming empty space by being removed together with the blowing region in a blowing process.

16 Claims, 7 Drawing Sheets

FUSE STRUCTURE FOR HIGH INTEGRATED SEMICONDUCTOR DEVICE

CROSS-REFERENCE TO RELATED APPLICATION

The priority based on Korean patent application No. 10-2009-0088370 filed on Sep. 18, 2009, the disclosure of which is hereby incorporated in its entirety by reference, is claimed.

BACKGROUND OF THE INVENTION

The present invention relates to a semiconductor device, and more specifically, to a fuse included in a high integrated semiconductor device for determining an electric signal transfer or an electric connection between different two terminals.

Generally, a fuse is defined as a kind of automatic cut-off device for preventing an overcurrent from flowing through an electric wire. That is, the fuse is melted due to heat generated by an overflow of electricity. Such a fuse can be easily found in common electrical appliances. The fuse allows the electric current to continuously flow at a normal level; however, once the fuse is cut, the electric current is permanently blocked unless the fuse is replaced with a new one. This point differentiates the fuse from a switch capable of controlling the flow of the electric current.

A semiconductor device is made using a number of processes including a process of doping impurities into a predetermined region within a silicon wafer and depositing new material thereon. A typical example of the semiconductor device is a semiconductor memory device. The semiconductor memory device internally includes many elements such as a transistor, a capacitor, a resistor and the like for performing a determined purpose, and the fuse is one of the elements included therein. The fuse is used in many areas within the semiconductor memory device. a redundancy circuit and a power supply circuit are typical examples of them. The fuse used in such a circuit is kept in a normal state (i.e., unblown state) during a manufacturing process. However, after the manufacturing process, the fuse can be selectively blown (i.e., cut) during a testing process.

Redundancy circuit will be explained in detail. In the case that a particular unit cell is defective in the semiconductor memory device, the defective unit cell is replaced with a redundant cell through a recovering step. That is, an address of the defective unit cell is stored at the recovering step in order to prevent the detective unit cell from being accessed. When an address of the defective unit cell is inputted externally, the redundant cell instead of the defective unit cell is activated by the redundancy circuit. The fuse of the redundancy circuit is used for storing the address of the defective unit cell at the recovering step, and the fuse coupled to the defective cell is subject to blowing by beaming a laser to that fuse so that an electrically connected point is permanently cut. This is referred as a fuse blowing.

In the case of the semiconductor memory device, a plurality of unit cells is included. After the manufacturing process, it is hard to find out how many unit cells are defective as well as where the defective unit cell exists among the plurality of unit cells. Therefore, a fuse box including a plurality of fuses is provided within the semiconductor memory device in order to replace the defective unit cells with the redundant cells.

The data storage capacity of a semiconductor memory device is increased more and more. Accordingly, the number of unit cells included in a semiconductor device each is increased and the number of fuses used for replacing defective unit cells with the redundant normal cells is also increased. On the contrary, the size of the semiconductor memory device is required to decrease for high integration. As above-mentioned, a laser is used to selectively blow out fuses. It is well known that a predetermined interval between adjacent fuses should be kept so as not to influence a neighboring fuse which is not a target of the blowing process. However, this characteristic of the fuse box is not compatible with high integration of the semiconductor memory device. Accordingly, a technology is required which is capable of preventing unselected fuses from being blown during a blowing process while keeping up the required integration.

FIGS. 1A and 1B are a plan view and a cross-sectional view for explaining a fuse included in a conventional semiconductor device.

Referring to FIG. 1A, a plurality of fuses 114 is arranged in parallel in a fuse box included in the conventional semiconductor device.

Referring to FIG. 1B, contacts 106 and 108 are formed under both ends of each fuse 114. The contacts 106 and 108 are respectively connected to different terminals to which different voltages are supplied or different circuits are connected.

In a center part of each fuse 114, a blowing region 122 is included. The blowing region 122 can be removed by beaming a laser during a blowing process in order to cut electricity between the both ends of the fuse 114.

FIGS. 2A and 2B are a cross-sectional view and a plan view for explaining operation and a problem of the fuse included in the conventional semiconductor device shown in FIG. 1.

FIG. 2A shows a normal structure after the blowing region 122 included in the fuse 114 is removed after the blowing process. If conductive material constituting the fuse 114 is completely removed, the both ends of the fuse 114 are electrically isolated from each other so that an electric charge flow between different two terminals connected through the contacts 106 and 108 is cut off.

Recently, the size and the area of a wire, a fuse and the like included in a highly integrated semiconductor device have been decreased increasing the resistance. Therefore, copper (Cu) whose resistance value is low is used as fuse material. However, copper (Cu) is soft and has high heat conductivity, and is also more corrosive compared with other commonly used metal materials. Thus, residuals generated when the fuse is blown or may migrate to adjacent areas under a high temperature condition or a high humidity condition.

Referring to FIG. 2B, even after fuse blowing process was done, at a partial fuse (114A), both ends of the fuse may still remain electrically connected due to migration of the copper (Cu). When the fuse remains connected due to copper migration even after the fuse blowing operation, the reliability of the semiconductor device may be seriously affected. Besides, migration of copper (Cu) may cause damage on a neighboring fuse which is not supposed to be blown.

For preventing the above-mentioned shortcomings such as thermal degradation and the like, metal such as aluminum, tungsten and the like whose heat conductivity is relatively low in comparison with the copper has been used for manufacturing the fuse. However, in the case of forming a fuse or a wire using these metals, high resistance of these metals cause problem at a microscopic level process, and thus a processing speed becomes slow or power loss may occur due to leakage current. To overcome this problem, the size of the fuse or the wire should be increased. However, this solution is not compatible with high integration of the semiconductor device. Alternatively, as above-mentioned, in the case of forming the fuse using the copper, the fuse formation is difficult due to the properties of the copper. Therefore, a new fuse which is suitable for a high integrated semiconductor memory device is required.

BRIEF SUMMARY OF THE INVENTION

Embodiments of the present invention provide a technology capable of improving an operation reliability of a semiconductor device and preventing both ends of a fuse from being still connected by residuals after a blowing process by forming a dummy contact under a blowing region of the fuse included in the semiconductor device in order for the residuals of the fuse to migrate to a region where a part of the dummy contact used to be formed, wherein the dummy contact is blown together with the blowing region through the blowing process.

In accordance with one embodiment of the present invention, there is provided a semiconductor device comprising a fuse having a blowing region at a center part for selectively connecting different two terminals; and a dummy contact positioned under the blowing region for forming empty space by being removed together with the blowing region in a blowing process.

Preferably, the dummy contact includes a plurality of pillar patterns.

Preferably, the semiconductor device further comprises a contact for connecting both ends of the fuse to the different two different terminals.

Preferably, the fuse includes copper, and the dummy contact and the contact include tungsten.

Preferably, the dummy contact and the contact are positioned under the fuse.

Preferably, a line width of the dummy contact is wider than that of the fuse.

In accordance with another embodiment of the present invention, there is provided a manufacturing method of a semiconductor device, comprising forming a dummy contact to which an electric signal is not applied; and forming a fuse for a blowing region included in a center part of the fuse to be positioned on the dummy contact.

Preferably, the manufacturing method of the semiconductor device further comprises forming a contact connected to the fuse together with the dummy contact.

Preferably, the manufacturing method of the semiconductor device further comprises forming a contact hole where the dummy contact and the contact are to be formed by etching an insulating film deposited on a semiconductor substrate.

Preferably, the fuse includes copper, and the dummy contact and the contact include tungsten.

Preferably, the dummy contact includes a plurality of pillar patterns.

Preferably, the manufacturing method of the semiconductor device further comprises forming a barrier metal film under the fuse.

Preferably, the barrier metal film includes a nitride film.

Preferably, the manufacturing method of the semiconductor device further comprises a nitride film on the fuse.

DESCRIPTION OF EMBODIMENTS

The present invention proposes a structure of a fuse capable of preventing a defect due to residues of copper from a blowing process. In the present embodiment, for overcoming the defect due to the residues at the timing of the blowing process, by forming a dummy contact under a blowing region of the fuse and selectively performing the blowing process for removing a part of the dummy contact together with the blowing region when the blowing region is removed, empty space can be secured under the fuse in order to confine conductive material migrated from both ends of the fuse.

The present embodiment is described in detail with reference to the accompanying drawings.

Figure 1A:
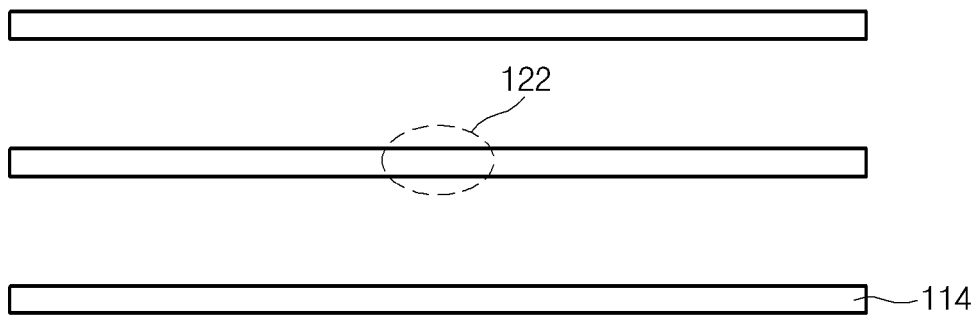
FIGS. 1A and 1B are a plan view and a cross-sectional view for explaining a fuse included in a conventional semiconductor device.
Figure 1B:
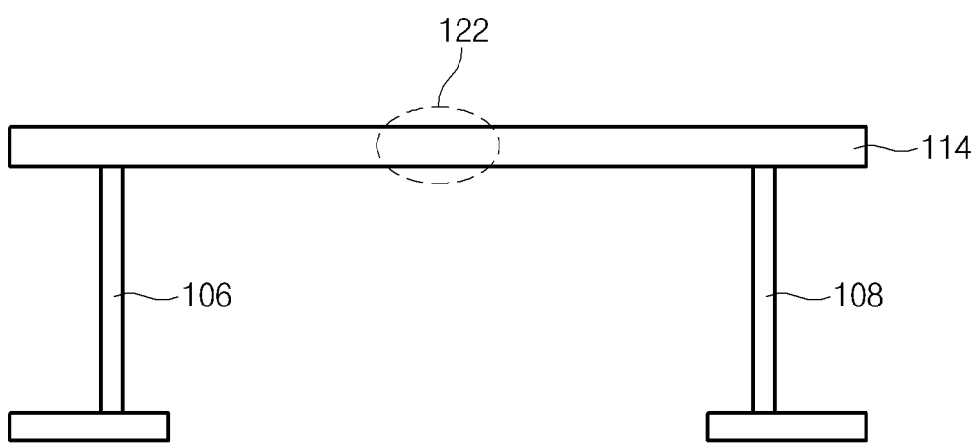
Figure 2A:
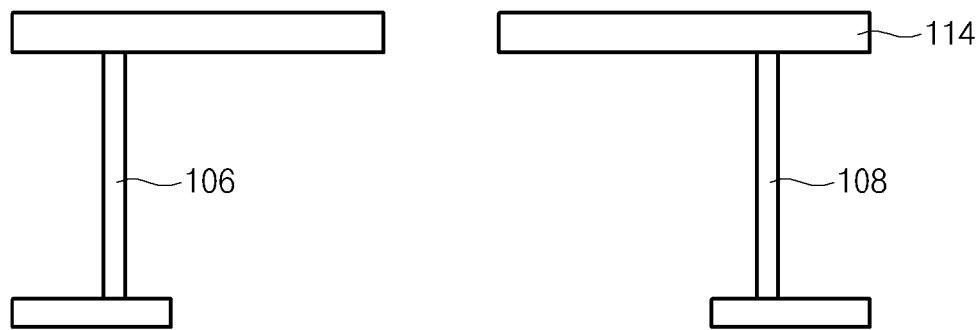
FIGS. 2A and 2B are a cross-sectional view and a plan view for explaining operation and a problem of the fuse included in the conventional semiconductor device shown in FIG. 1.
Figure 2B:
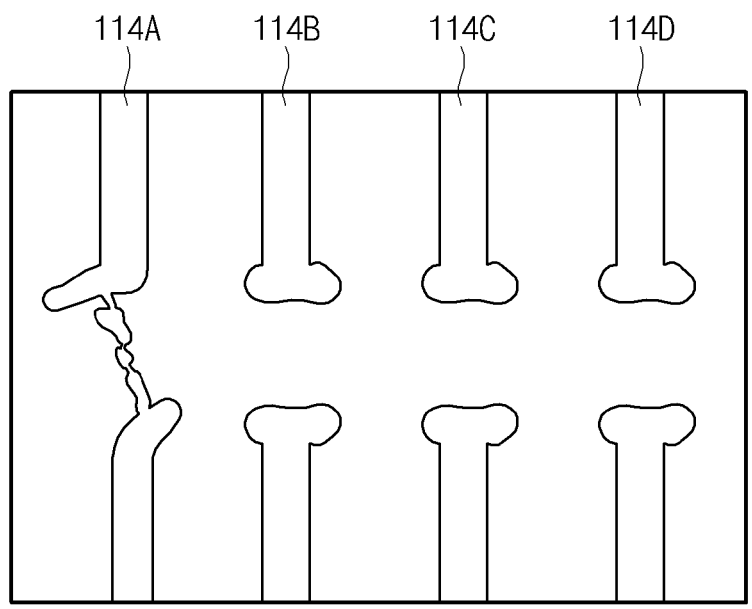
Figure 3A:
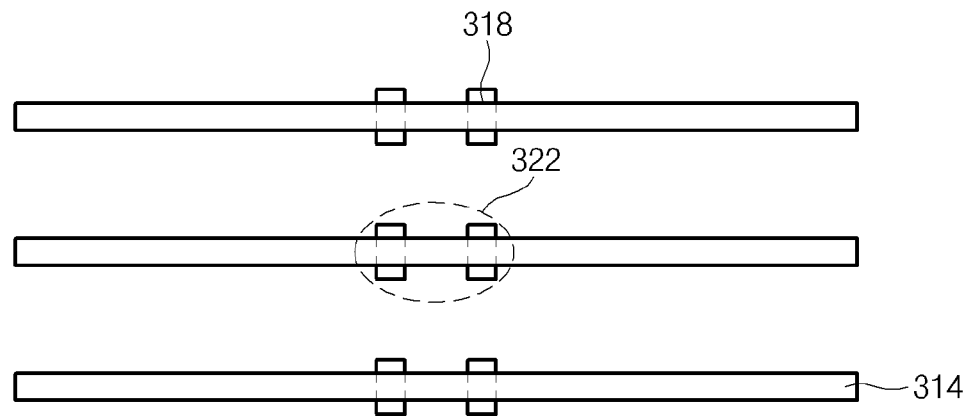
FIGS. 3A and 3B are a plan view and a cross-sectional view for explaining a fuse included in a semiconductor device in accordance with an embodiment of the present invention.
Figure 3B:
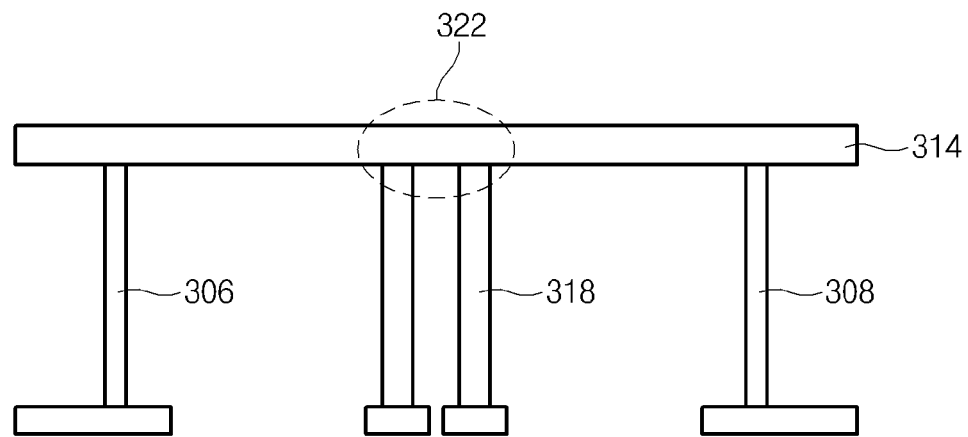

FIGS. 3A and 3B are a plan view and a cross-sectional view for explaining a fuse included in a semiconductor device in accordance with the embodiment of the present invention.

Referring to FIG. 3A, a plurality of fuses 314 are arranged in parallel in a fuse box included in the semiconductor device. In a center part of each fuse 314, a blowing region 322 is provided. The blowing region 322 is blown or melted by beaming a laser during the blowing process in order to cut the fuse and electrically separate the both ends of the fuse 314. A dummy contact 318 is formed under the blowing region 322 of the fuse 314 in the present embodiment.

Referring to FIG. 3B, contacts 306 and 308 are formed under the both ends of each fuse 314. The contacts 306 and 308 are respectively connected to different terminals to which different voltages are supplied or different circuits are connected.

Referring to FIGS. 3A and 3B, although two dummy contacts 318 are formed under the blowing region 322 included in each fuse 314, the size and the number of the dummy contact 318 may vary according to implementation. Particularly, as shown in FIG. 3A, a line width of the dummy contact 318 can be formed wider than that of the fuse 314.

Also, the fuse 314 can be formed with tungsten (W). At this time, conductive materials such as tungsten (W) and aluminum (Al) can be used for the dummy contact 318 and the contacts 306 and 308.

Herein, the dummy contact 318 can be formed at the time the contacts 306 and 308 are formed by additionally forming a dummy contact hole (not shown) by etching an insulating film and then filling conductive material in the dummy contact 318. The dummy contact 318 is not connected any voltage or signal node in the semiconductor device.

However, since the dummy contact 318 is formed with the conductive material, the dummy contact 318 plays a role of dispersing stress or heat which is applied to the fuse 314 and transferred through the both ends of the fuse 314 when the blowing process is performed. If the stress is dispersed at the timing of the blowing process, damage of thermal oxidation or the like to a neighboring fuse 314 or an internal structure element of the semiconductor device can be prevented.

Also, at the timing of the blowing process, an upper part of the dummy contact 318 can be removed together with the blowing region 322 because of the stress or the like. As a result, a trench or a recess, i.e., an empty space wherein the upper part of the dummy contact 318 was formed, is formed under the blowing region 322 between the both ends of the fuse 314. The trench or the recess generated after the blowing process can collect conductive material such as copper (Cu) blown from the both ends of the fuse 314 so that the both ends of the fuse 314 can be prevented from being electrically connected by the residuals.

Figure 4:
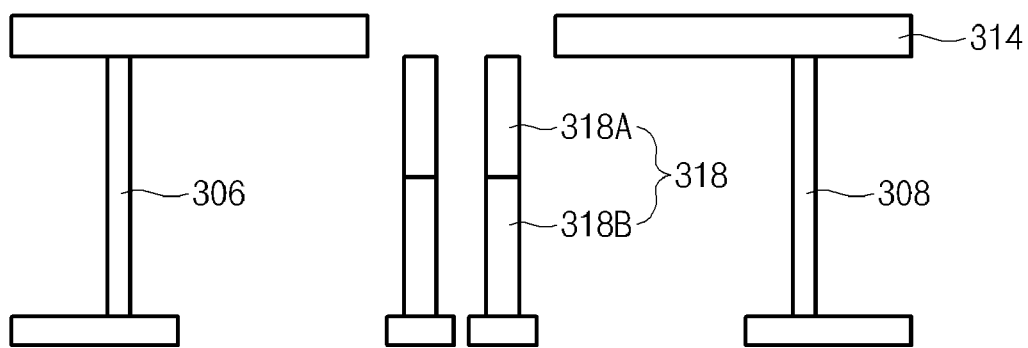
FIG. 4 is a cross-sectional view for explaining a fuse blowing process included in the semiconductor device shown in FIG. 3A.

FIG. 4 is a cross-sectional view for explaining the blowing process of the fuse included in the semiconductor device shown in FIG. 3A.

As shown, after the blowing region 322 within the fuse 314 is removed due to the blowing process, the residues flow into an upper part of the dummy contact 318, wherein the trench is defined. The dummy contact 318 has different materials for its lower part 318B and its upper part 318A.

For instance, in the case that the dummy contact 318 is formed with tungsten (W) and the fuse 314 is formed with the copper (Cu), the lower part 318B of the dummy contact 318 still comprises tungsten (W) even after the blowing process, but the upper part 318A of the dummy contact 318 comprises of copper (Cu) instead of tungsten (W) because tungsten (W) formed as the upper part 318A of the dummy contact 318 is removed by the blowing process and then copper (Cu) is migrated from remained parts of the fuse 314 to the upper part 318A of the dummy contact 318 after the blowing process. Since residues are less likely to remain between the two fuse pieces that have been blown, the blown fuse will remain blown so that an electric charge flow between different two terminals connected through the contacts 306 and 308 can be easily cut off.

FIGS. 5A to 5E are cross-sectional views for explaining a manufacturing method of the fuse included in the semiconductor device shown in FIG. 3A.

Figure 5A:
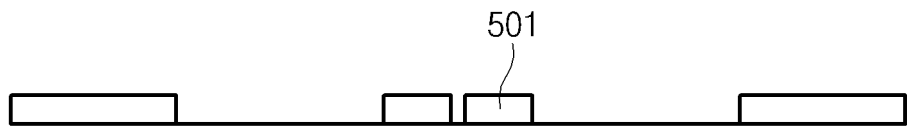
FIGS. 5A to 5E are cross-sectional views for explaining a manufacturing method of the fuse included in the semiconductor device shown in FIG. 3A.

Referring to FIG. 5A, a contact plug 501 is formed on a terminal over a semiconductor substrate which is to be electronically coupled to the fuse 314. At the same time, the contact plug 501 for a dummy contact is also formed under a location where the blowing region 322 of the fuse 314 is to be formed.

Figure 5B:
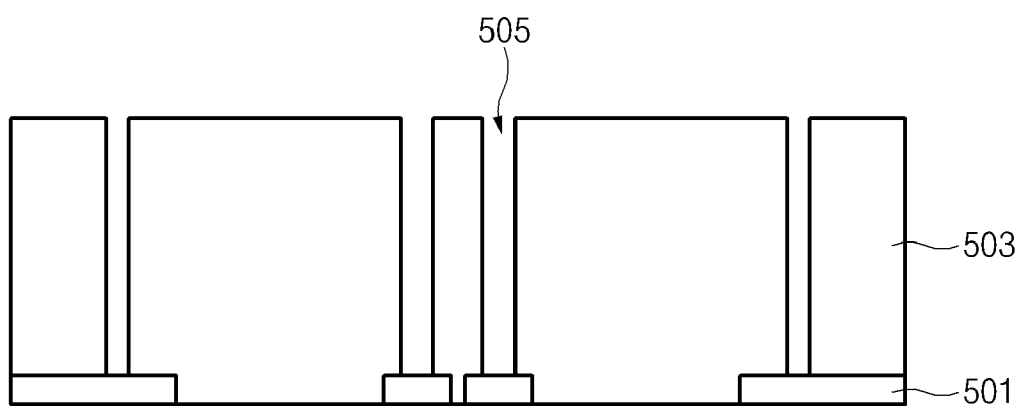

Referring to FIG. 5B, an insulating layer 503 is deposited on the semiconductor substrate and then selectively etched to form a contact hole 505 exposing the contact plug.

Figure 5C:
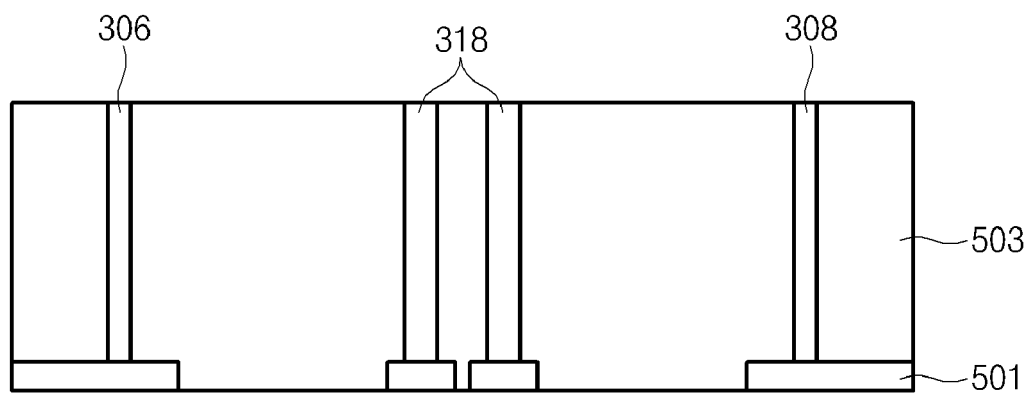

Referring to FIG. 5C, by filling the contact hole 505 with conductive material, the contacts 306 and 308 and the dummy contacts 318 are formed.

Figure 5D:
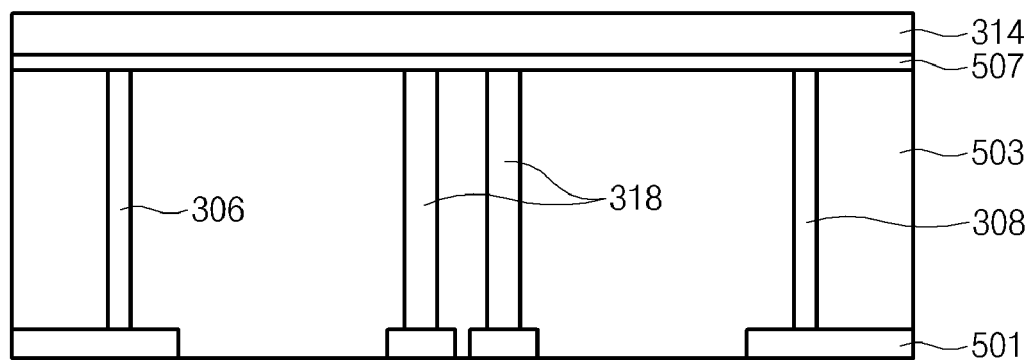

Referring to FIG. 5D, an insulating layer (not shown) is formed over the contacts 306 and 308 and the dummy contacts 318. Then, the insulating layer (not shown) is selectively etched to form a trench (not shown) which exposes upper surfaces of the contacts 306 and 308 and the dummy contacts 318. Thereafter, a barrier metal film 507 is formed on the surface of the trench, and the fuse 314 is formed on the barrier metal film 507.

Figure 5E:
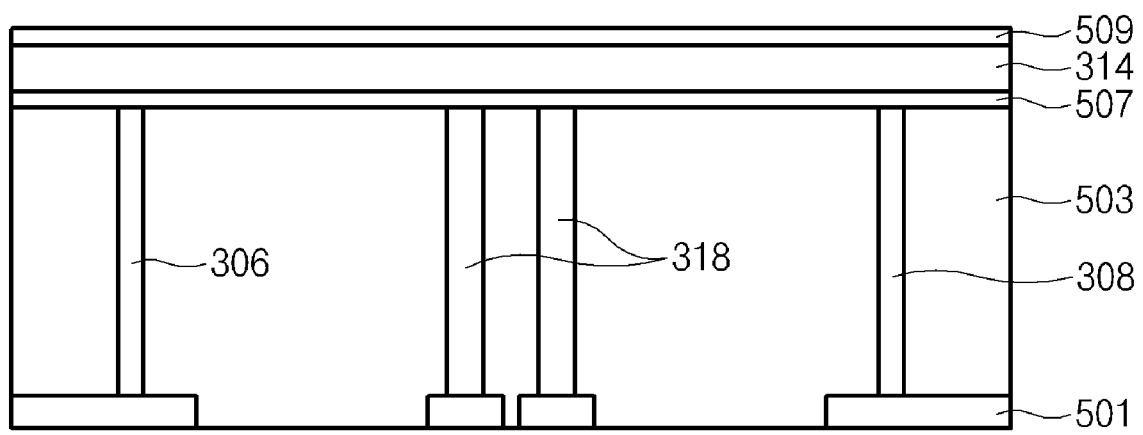

Referring to FIG. 5E, a natural oxide film (not shown) possibly formed on the fuse 314 is removed and a dama cleaning operation is performed onto the fuse 314 for improving interface characteristics. Then, a nitride film 509 is deposited on the fuse 314.

As above-mentioned, the semiconductor device in accordance with an embodiment of the present invention includes a fuse having a blowing region at a center part for selectively connecting different two terminals and a dummy contact positioned under the blowing region for forming empty space by being blown together with the blowing region during the blowing process. Particularly, when the blowing region is removed through the blowing process, a part of the dummy contact is also removed together so that the empty space such as the trench or the bunker is formed. The residues from the blown fuse migrate into the trench after the blowing process. Accordingly, in accordance with the present invention, the defect of the connection between the both ends of the fuse after the blowing process can be prevented.

Further, in accordance with present invention, even if the fuse is formed using the copper, thermal degradation or residue migration generated during the blowing process can be prevented and the fuse can have a low resistance value. Accordingly, the processing speed drop or power loss due to leakage current can be prevented.

Although the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a fuse having a blowing region between two terminals;
   a first node defined within the blowing region; and
   a first dummy contact formed under the blowing region and coupled to the first node,
   wherein the first dummy contact is configured to be blown to form a recess when the fuse is blown, and
   wherein the recess is configured to collect residues from the blown fuse.

2. The semiconductor device according to claim 1, further comprising:
   a second node defined within the blowing region; and
   a second dummy contact formed under the blowing region and coupled to the second node.

3. The semiconductor device according to claim 1, further comprising first and second terminal contacts for electrically coupling the two terminals of the fuse.

4. The semiconductor device according to claim 3, wherein the fuse includes copper, and the dummy contact and the first and the second terminal contacts include tungsten.

5. The semiconductor device according to claim 3, wherein the first and the second terminal contacts are positioned under the both ends of the fuse, respectively.

6. The semiconductor device according to claim 1, wherein a line width of the dummy contact is wider than that of the fuse.

7. The semiconductor device according to claim 1, wherein the blowing region is located at about middle point between the two terminals of the fuse.

8. The semiconductor device according to claim 1, wherein the dummy contact is configured to float.

9. A manufacturing method of a semiconductor device, comprising:
   forming a dummy contact hole over a substrate;
   forming a dummy contact within the dummy contact hole; and
   forming a fuse having a blowing region and a node provided within the blowing region, the node formed over the dummy contact,
   wherein the dummy contact is configured to be blown to form a recess when the fuse is blown, and
   wherein the recess is configured to collect residues from the blown fuse.

10. The manufacturing method of the semiconductor device according to claim 9, further comprising forming terminal contacts electrically coupled to the fuse.

11. The manufacturing method of the semiconductor device according to claim 10, further comprising:
    forming an insulation film over the substrate;

etching the insulating film formed over the substrate to form the dummy contact hole; and filling the dummy contact hole with a conductive material to form the dummy contact, wherein the same conductive material is used form the terminal contacts.

12. The manufacturing method of the semiconductor device according to claim 10, wherein the fuse includes copper, and the dummy contact and the terminal contact include tungsten.

13. The manufacturing method of the semiconductor device according to claim 9, wherein a plurality of dummy contacts are provided under the blowing region.

14. The manufacturing method of the semiconductor device according to claim 9, wherein a barrier metal film is provided under the fuse.

15. The manufacturing method of the semiconductor device according to claim 14, wherein the barrier metal film includes a nitride film.

16. The manufacturing method of the semiconductor device according to claim 9, further comprising forming a nitride film over the fuse.

* * * * *